(12) United States Patent
Huang et al.

(10) Patent No.: US 6,521,922 B1
(45) Date of Patent: Feb. 18, 2003

(54) PASSIVATION FILM ON A SEMICONDUCTOR WAFER

(75) Inventors: Chi-Tung Huang, Hsin-Chu (TW); Wan-Yi Liu, Kao-Hsiung (TW)

(73) Assignee: Macronix International Co. Ltd., Hsin-Chu (TW)

( * ) Notice: Subject to any disclaimer, the term of this patent is extended or adjusted under 35 U.S.C. 154(b) by 0 days.

(21) Appl. No.: 09/514,261

(22) Filed: Feb. 28, 2000

(51) Int. Cl.⁷ .............................................. H01L 29/72
(52) U.S. Cl. ...................... 257/288; 257/256; 257/306; 257/368; 438/622; 438/624; 438/626; 438/633; 438/692; 438/697; 438/762; 438/780
(58) Field of Search ................................. 257/288, 256, 257/306, 368; 438/622, 624, 626, 633, 692, 697, 762, 780

(56) References Cited

U.S. PATENT DOCUMENTS 5,858,870 A * 1/1999 Zheng et al. ................ 257/288

* cited by examiner

Primary Examiner—Edward Wojciechowicz
(74) Attorney, Agent, or Firm—Winston Hsu

(57) ABSTRACT

The present invention provides a passivation film on a semiconductor wafer. The semiconductor wafer comprises a dielectric layer and a patterned conductive layer on the dielectric layer. The passivation film comprises a high density plasma (HDP) oxide layer positioned on the surface of the conductive layer and on the surface of the dielectric layer that is not covered by the conductive layer, a silicon nitride layer positioned on the HDP oxide layer, and a water-resistant layer positioned on the silicon nitride layer. The HDP oxide layer possesses good gap filling abilities to fill the spaces inside the conductive layer.

20 Claims, 1 Drawing Sheet

PASSIVATION FILM ON A SEMICONDUCTOR WAFER

BACKGROUND OF THE INVENTION

1. Field of the Invention

The present invention relates to a passivation film, and more particularly, to a passivation film on a semiconductor wafer.

2. Description of the Prior Art

In semiconductor processing, the frames of the ICs are formed on the semiconductor wafer after completing the primary processes, like metallization and planarization. These ICs are easily damaged by inadvertent collisions or long-term exposure to humidity and moisture. Therefore, a passivation film is formed on the surface of the semiconductor wafer to protect the underlying ICs.

Please refer to FIG. 1. FIG. 1 is a cross-sectional schematic diagram of a passivation film 24 formed on a semiconductor wafer according to the prior art. The passivation film 24 is used to protect an erasable programmable read-only memory (EPROM), or flash memory, that is formed on the semiconductor wafer 10. The semiconductor wafer 10 comprises a dielectric layer 12 and a patterned conductive layer 14 positioned on the dielectric layer 12. The surface of the semiconductor wafer 10 is covered by the passivation film 24. The passivation film 24 comprises an ultra-violet silicon nitride (UVSiN) layer 16 positioned on the dielectric layer 12 and the conductive layer 14, a spin-on glass (SOG) layer 18 positioned on the UVSiN layer 16, a silicon-oxy-nitride layer (SiON) layer 20 positioned on the SOG layer 18, and a phosphosilicate glass (PSG) layer 22 positioned on the SiON layer 20.

According to a prior art method of forming the passivation film 24, a chemical vapor deposition (CVD) process is first performed to deposit the UVSiN layer 16 of uniform thickness on the semiconductor wafer 10 to cover the surface of the dielectric layer 12 and the conductive layer 14. Then, SOG is coated on the semiconductor wafer to fill the spaces inside the conductive layer 14. A heat treatment is used to cure the SOG so as to form the SOG layer 18 on the UVSiN layer 16. Finally, the SiON layer 20 and the PSG layer 22 are sequentially deposited on the semiconductor wafer 10. This completes the passivation film 24.

However, SOG possesses a gap filling ability that is only applicable to a line width that is wider than a 0.5-micrometer semiconductor process. As for narrower semiconductor processes, SOG cannot fill the concavities formed inside the conductive layer 14, and thus will bring about voids. This will decrease the cracking-resistance, water-resistance, and ion-resistance of the passivation film 24. Hence, the passivation film 24 fails to adequately protect the underlying ICs.

SUMMARY OF THE INVENTION

It is therefore a primary objective of the present invention to provide a passivation film on a semiconductor wafer to fill the concavities on the semiconductor wafer so as to prevent voids and thus ensure the ability of the passivation layer to protect the underlying ICs.

In a preferred embodiment, the present invention provides a passivation film on a semiconductor wafer. The semiconductor wafer comprises a dielectric layer and a patterned conductive layer on the dielectric layer. The passivation film comprises a high density plasma (HDP) oxide layer positioned on the surface of the conductive layer and on the surface of the dielectric layer that is not covered by the conductive layer, a silicon nitride layer positioned on the HDP oxide layer, and a water-resistant layer positioned on the silicon nitride layer. The HDP oxide layer possesses good gap filling abilities to fill the spaces inside the conductive layer.

It is an advantage of the present invention that the passivation film comprises the HDP oxide layer, which can completely fill the spaces inside the conductive layer to prevent voids and so protect the underlying ICs.

This and other objectives of the present invention will no doubt become obvious to those of ordinary skill in the art after having read the following detailed description of the preferred embodiment, which is illustrated in the various figures and drawings.

DETAILED DESCRIPTION OF THE PREFERRED EMBODIMENT

Figure 1:
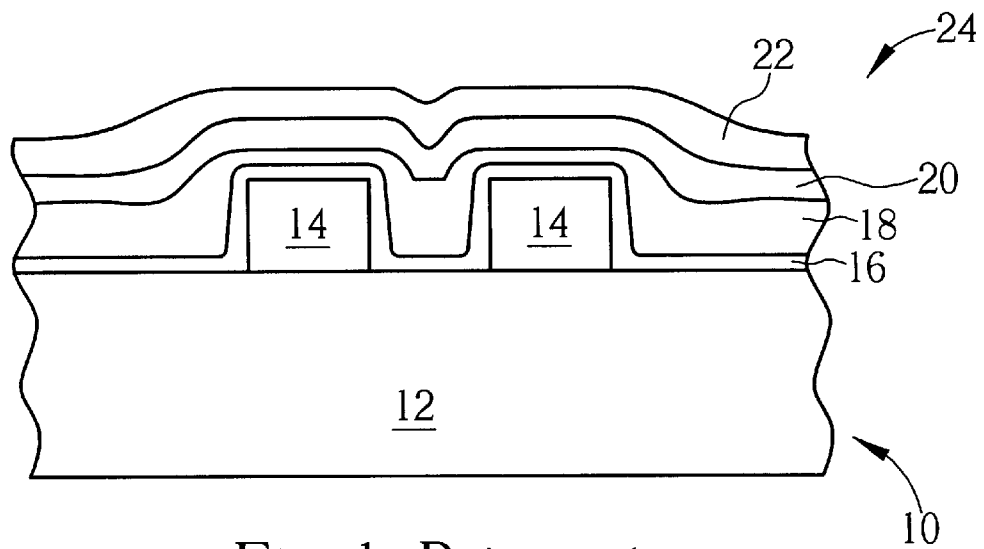
FIG. 1 is a cross-sectional diagram of a passivation film formed on a semiconductor wafer according to the prior art.
Figure 2:
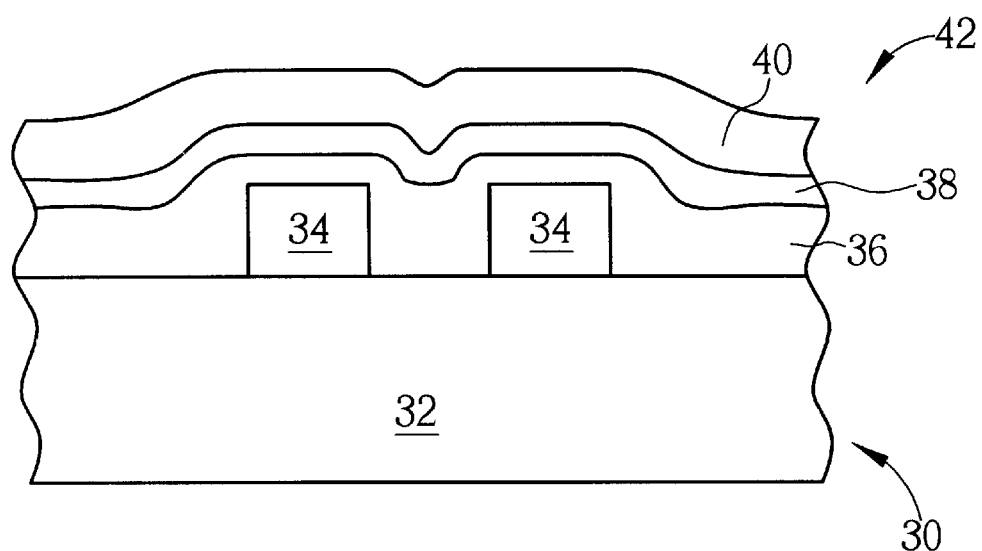
FIG. 2 is a cross-sectional diagram of a passivation film formed on a semiconductor wafer according to the present invention.

Please refer to FIG.2. FIG.2 is a cross-sectional diagram of a passivation film 42 formed on a semiconductor wafer 30 according to the present invention. The passivation film 42 is used to protect an EPROM, or flash memory, that is formed on the semiconductor wafer 30. The semiconductor wafer 30 comprises a dielectric layer 32 and a patterned conductive layer 34 on the dielectric layer 32. The surface of the semiconductor wafer 30 is covered by the passivation film 42. The passivation film 42 comprises a high density plasma (HDP) oxide layer 36 positioned on the surface of the conductive layer 34 and on those surfaces of the dielectric layer 32 that are not covered by the conductive layer 34. The passivation film 42 further comprises a silicon nitride layer 38 positioned on the HDP oxide layer 36, and a water-resistant layer 40 positioned on the silicon nitride layer 38.

The thickness of the HDP oxide layer 36 is about 8500 Å. The HDP oxide layer 36 possesses good gap filling abilities and so can fill the spaces inside the conductive layer 34. The thickness of the silicon nitride layer 38 is about 4000 Å. The silicon nitride layer 38 is made from ultra-violet silicon nitride (UVSiN), which transmits ultra-violet radiation, and possesses good ion-resistance and water-resistance properties. The thickness of the water-resistant layer 40 is about 9000 Å. The water-resistant layer 40 is made from phosphosilicate glass (PSG), and possesses good moisture-repelling abilities, as well as providing a permanent protection against alkali ion migration.

The silicon nitride layer 38 of the passivation film 42 could also be made from silicon-oxy-nitride (SiON) with a thickness of about 6000 Å. Such a layer also possesses ultra-violet transmission abilities, and offers excellent protection from moisture and other impurities.

The method of forming the passivation film 42 of the present invention comprises performing a high density plasma chemical vapor deposition (HDPCVD) process to form the HDP oxide layer 36 and then performing a deposition process to sequentially form the silicon nitride layer 38 and the water-resistant layer 40.

Based upon observations with a scanning electron microscope (SEM), the HDP oxide layer 36 appears to completely fill the spaces inside the conductive layer 34, preventing voids. Furthermore, after performing electrical tests on the semiconductor wafer 30 where the passivation film 42 is formed, it was found that the underlying ICs had a narrower threshold voltage shift than the ICs of the prior art semiconductor wafer 10. Therefore, it is believed that the passivation film 42 possesses superior cracking-resistance, water-resistance and metallic ion-resistance characteristics to better protect the underlying ICs.

Compared to the prior art passivation film 24, the passivation film 42 on the semiconductor wafer 30 of the present invention comprises the HDP oxide layer 36, the silicon nitride layer 38 and the water-resistant layer 40. The passivation film 42 completely fills the spaces inside the conductive layer 34, which prevents voids and ensures that the underlying ICs are adequately protected.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A passivation film on a semiconductor wafer, the semiconductor wafer comprising a dielectric layer and a patterned conductive layer on the dielectric layer, the passivation film comprising:

a high density plasma (HDP) oxide layer positioned on the surface of the conductive layer and on the surface of the dielectric layer that is not covered by the conductive layer;

a silicon nitride layer positioned on the HDP oxide layer; and a water-resistant layer positioned on the silicon nitride layer;

wherein the HDP oxide layer possesses good gap filling abilities to fill the spaces inside the conductive layer.

2. The passivation film of claim 1 wherein the HDP oxide layer is formed using a high density plasma chemical vapor deposition (HDPCVD) process.

3. The passivation film of claim 1 wherein the thickness of the HDP oxide layer is between 8000 Å and 15000 Å.

4. The passivation film of claim 1 wherein the silicon nitride layer is made from ultra-violet silicon nitride (UVSiN).

5. The passivation film of claim 4 wherein the thickness of the silicon nitride layer is between 2000 Å and 6000 Å.

6. The passivation film of claim 1 wherein the silicon nitride layer is made from silicon-oxy-nitride (SiON).

7. The passivation film of claim 6 wherein the thickness of the silicon nitride layer is between 4000 Å and 8000 Å.

8. The passivation film of claim 1 wherein the water-resistant layer is made from phosphosilicate glass (PSG).

9. The passivation film of claim 8 wherein the thickness of the water-resistant layer is between 6000 Å and 12000 Å.

10. The passivation film of claim 1 wherein the passivation film is used for protecting an erasable programmable read-only memory (EPROM) or a flash memory that is formed on the semiconductor wafer.

11. A method of forming a passivation film on a semiconductor wafer, the semiconductor wafer comprising a dielectric layer and a patterned conductive layer on the dielectric layer, the method comprising:

forming a high density plasma (HDP) oxide layer on the surface of the conductive layer and on the surface of the dielectric layer that is not covered by the conductive layer to fill the spaces inside the conductive layer;

forming a silicon nitride layer on the HDP oxide layer; and forming a water-resistant layer on the silicon nitride layer.

12. The method of claim 11 wherein the HDP oxide layer is formed using a high density plasma chemical vapor deposition (HDPCVD) process.

13. The method of claim 11 wherein the thickness of the HDP oxide layer is between 5000 Å and 15000 Å.

14. The method of claim 11 wherein the silicon nitride layer is made from ultra-violet silicon nitride (UVSiN).

15. The method of claim 14 wherein the thickness of the silicon nitride layer is between 2000 Å and 6000 Å.

16. The method of claim 11 wherein the silicon nitride layer is made from silicon-oxy-nitride (SiON).

17. The method of claim 16 wherein the thickness of the silicon nitride layer is between 4000 Å and 8000 Å.

18. The method of claim 11 the water-resistant layer is made from phosphosilicate glass (PSG).

19. The method of claim 18 wherein the thickness of the water-resistant layer is between 6000 Å and 12000 Å.

20. The method of claim 11 wherein the passivation film is used for protecting an erasable programmable read-only memory (EPROM) or a flash memory that is formed on the semiconductor wafer.

* * * * *